United States Patent
Muzzetto et al.

(10) Patent No.: US 11,776,590 B2
(45) Date of Patent: Oct. 3, 2023

(54) ON-THE-FLY PROGRAMMING AND VERIFYING METHOD FOR MEMORY CELLS BASED ON COUNTERS AND ECC FEEDBACK

(71) Applicant: Micron Technology, Inc., Boise, ID (US)

(72) Inventors: Riccardo Muzzetto, Arcore (IT); Ferdinando Bedeschi, Biassono (IT); Umberto Di Vincenzo, Capriate san Gervasio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/748,866

(22) Filed: May 19, 2022

(65) Prior Publication Data
US 2022/0351758 A1    Nov. 3, 2022

Related U.S. Application Data

(63) Continuation of application No. 17/075,502, filed on Oct. 20, 2020, now Pat. No. 11,450,358.

(30) Foreign Application Priority Data

Mar. 3, 2020    (WO) .................. PCT/IB2020/000080

(51) Int. Cl.
*G11C 7/10*    (2006.01)
*G11C 7/06*    (2006.01)
(Continued)

(52) U.S. Cl.
CPC .............. *G11C 7/1009* (2013.01); *G11C 7/06* (2013.01); *G11C 7/1012* (2013.01); *G11C 16/10* (2013.01); *G11C 16/26* (2013.01); *G11C 29/42* (2013.01)

(58) Field of Classification Search
CPC ....... G11C 7/1009; G11C 7/06; G11C 7/1012; G11C 16/10; G11C 16/26; G11C 29/42
See application file for complete search history.

(56) References Cited

U.S. PATENT DOCUMENTS

| | | |
|---|---|---|
| 5,353,403 A | 10/1994 | Kohiyama et al. |
| 5,544,306 A | 8/1996 | Deering et al. |

(Continued)

FOREIGN PATENT DOCUMENTS

| | | |
|---|---|---|
| EP | 2204816 B1 | 7/2014 |
| JP | 2010-033674 A | 2/2010 |

(Continued)

OTHER PUBLICATIONS

European Search Report and Search Opinion received for EP Application No. 21153095.1, dated Jun. 21, 2021, 9 pages.

(Continued)

*Primary Examiner* — Vanthu T Nguyen
(74) *Attorney, Agent, or Firm* — Holland & Hart LLP

(57) ABSTRACT

The present invention relates to a method of operating memory cells, comprising reading a previous user data from the memory cells; writing a new user data and merging the new user data with the previous user data into write registers; generating mask register information, and wherein the mask register information indicates bits of the previous user data stored in the memory cells to be switched or not to be switched in their logic values; counting numbers of a first logic value and a second logic value to be written using the mask register information, respectively; storing the numbers of the first logic value and the second logic value into a first counter and a second counter, respectively; and applying a programming pulse to the memory cells according to the mask register information.

20 Claims, 11 Drawing Sheets

(51) Int. Cl.
*G11C 16/10* (2006.01)
*G11C 16/26* (2006.01)
*G11C 29/42* (2006.01)

(56) References Cited

U.S. PATENT DOCUMENTS

| | | | |
|---|---|---|---|
| 6,262,748 B1 | 7/2001 | Deering et al. | |
| 7,746,688 B2 | 6/2010 | Kim et al. | |
| 8,223,527 B2 | 7/2012 | Lee et al. | |
| 8,250,417 B2 * | 8/2012 | Feeley | G06F 11/1068 714/718 |
| 9,355,701 B2 | 5/2016 | Oh et al. | |
| 10,529,421 B2 | 1/2020 | Jeong et al. | |
| 2006/0047369 A1 | 3/2006 | Brewster et al. | |
| 2006/0248258 A1 | 11/2006 | Persoon | |
| 2007/0282932 A1 | 12/2007 | Rhim et al. | |
| 2010/0054017 A1 | 3/2010 | Maejima | |
| 2010/0080071 A1 | 4/2010 | Huang et al. | |
| 2013/0339637 A1 | 12/2013 | Ishii et al. | |
| 2014/0104956 A1 | 4/2014 | Pabustan et al. | |
| 2014/0269043 A1 | 9/2014 | Chu | |
| 2014/0281824 A1 | 9/2014 | Oh et al. | |
| 2016/0358662 A1 | 12/2016 | Chen et al. | |
| 2019/0164605 A1 | 5/2019 | Jeong et al. | |
| 2019/0371395 A1 | 12/2019 | Lin et al. | |

FOREIGN PATENT DOCUMENTS

| | | |
|---|---|---|
| JP | 2014-026712 A | 2/2014 |
| KR | 10-2014-0113101 A | 9/2014 |
| KR | 10-2019-0061855 A | 6/2019 |
| WO | 2014/158536 A1 | 10/2014 |
| WO | 2015/121868 A1 | 8/2015 |

OTHER PUBLICATIONS

International Search Report and Written Opinion received for PCT Patent Application No. PCT/IB2020/000080, dated Nov. 20, 2020, 8 pages.

Japanese Patent Office, "Notice of Rejection Ground," issued in connection with Japanese Patent Application No. 2020-212715, dated Feb. 8, 2022 (6 pages).

Korean Intellectual Property Office, "Notice of Reasons for Rejection," issued in connection with Korean Patent Application No. 10-2020-0185812, dated Jan. 26, 2022 (5 pages).

Taiwan Intellectual Property Office, "Office Action," issued in connection with ROC (Taiwan) Patent Application No. 109139851 dated Jul. 12, 2021 (3 pages).

* cited by examiner

ON-THE-FLY PROGRAMMING AND VERIFYING METHOD FOR MEMORY CELLS BASED ON COUNTERS AND ECC FEEDBACK

CROSS REFERENCE

The present Application for Patent is a continuation of U.S. patent application Ser. No. 17/075,502 by Muzzetto, et al., titled "ON-THE-FLY PROGRAMMING AND VERIFYING METHOD FOR MEMORY CELLS BASED ON COUNTERS AND ECC FEEDBACK", filed Oct. 20, 2020, which claims priority to International Patent Application No. PCT/IB2020/000080 by Muzzetto, et al., titled "ON-THE-FLY PROGRAMMING AND VERIFYING METHOD FOR MEMORY CELLS BASED ON COUNTERS AND ECC FEEDBACK", filed Mar. 3, 2020, each of which is assigned to the assignee hereof and each of which is expressly incorporated by reference in its entirety herein.

FIELD OF TECHNOLOGY

The following relates generally to operating a memory array and more specifically to an on-the-fly programming and verifying method for memory cells based on counters and ECC feedback.

BACKGROUND

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics. A more robust read technique may be desired to increase memory cell performance and reliability when memory cells exhibit variable electrical characteristics, in particular memory devices having a three-dimensional (3D) array of memory cells.

DETAILED DESCRIPTION

Figure 1:
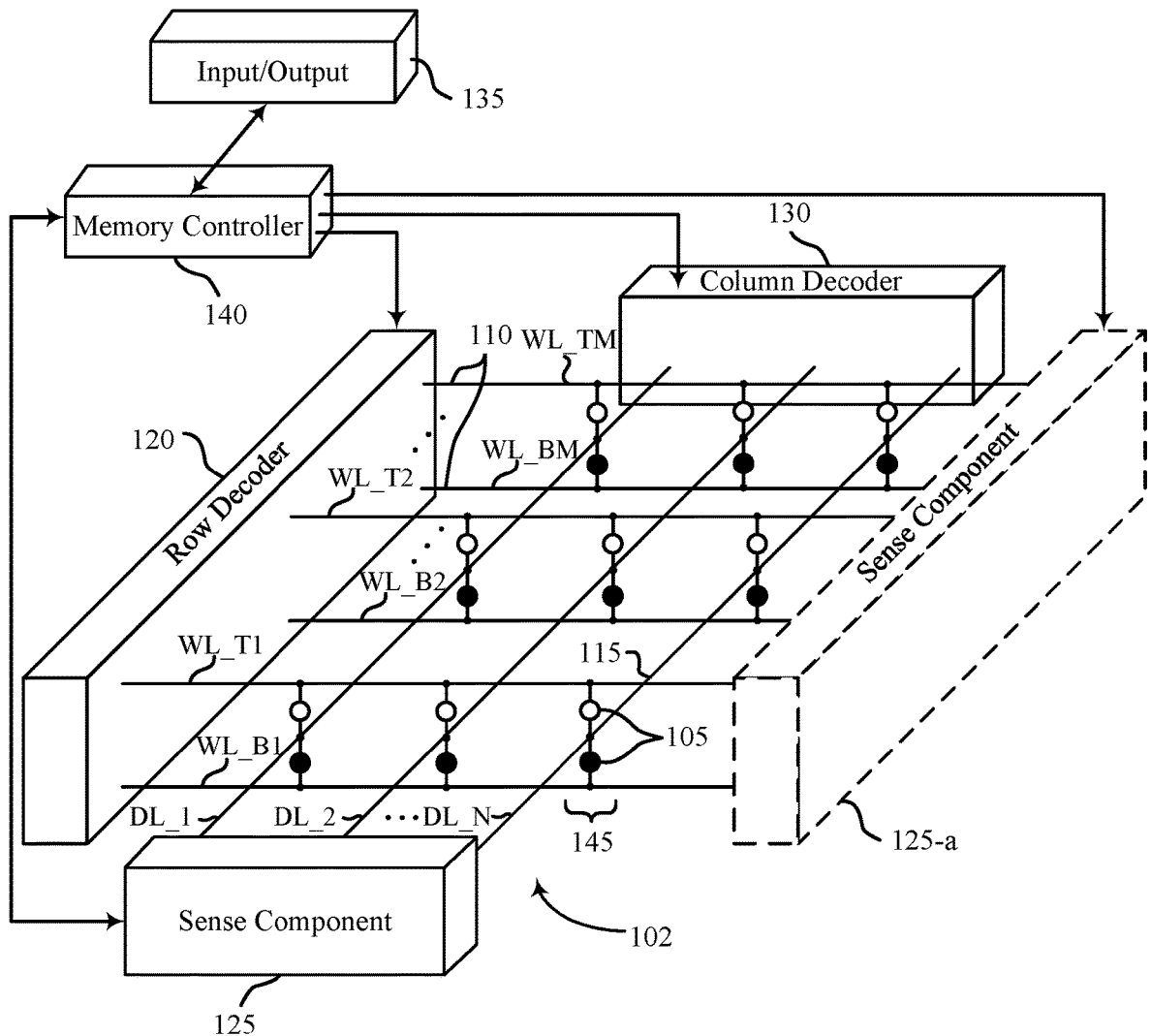
FIG. 1 illustrates an example of a memory device diagram having a three-dimensional (3D) array of memory cells that supports an on-the-fly programming and verifying method for memory cells based on counters and ECC feedback in accordance with examples of the present disclosure.

In a memory device, for example a self-selecting memory (SSM) cross-point device or a ferroelectric (FeRAM) non-volatile memory device, during an access operation to program data corresponding to a codeword in memory cells of the array, the codeword data (and possible associated parity bits) are received at input terminals of the memory device. The memory controller analyzes the input data and determines the number of bits in the different logic states; for example, the memory controller determines how many logic 0's and/or how many logic 1's are present in the codeword. The memory controller may manipulate, or encode, the codeword to reduce the programming voltage, improve cycling, reduce power, and reduce disturbs.

The memory device may be already written (for instance after the verify phase in the factory) and therefore the cells include a logic value "1" or "0". The memory content may be read in any case. Only after a reading phase, the writing may be performed. A codeword CW may be programmed, but the codeword where the new value may be programmed may be already stored in the memory cells, and therefore the cells include a series of "1" and "0" logic values.

A proper codeword (CW) analysis comparing the logic values already stored in the codeword with the number of "1's" or 0's to be later used during the write algorithm may be performed. This analysis is performed after the storing in volatile (or non-volatile) counters just the number of "1" or "0" of the codeword. This allows reducing the number of cells to be programmed. If the logic value "1" is required to be programmed in a memory cell wherein the logic value "1" is already stored in this memory cell, there may be no need to do anything and the programming phase of that cell may be omitted. This action is called masking. A register may be provided, and all programmed or masked bits may be stored in the register.

The programming pulse is shifted on those bits that are already stored with the same logic value of the bit of the new codeword. Even during the programming phase of the remaining bits, i.e. the bits that are to be modified in their logic values, the raising programming pulse may be stopped once a bit is changed in its logic value thus avoiding to stress the bit with higher voltage value. To implement this procedure, at least a register including the codeword that is to be programmed and a register including the already programmed codeword may be provided. From both these two registers, a new register including the masks may be extracted, i.e. the bits that may be left as they are. A third register may be not even necessary or used because the codeword to be written could be stored in the registers of the sense amplifier. In any case, a third register would be a temporary register. A comparison between the codeword to be written and the codeword already stored may generate an "on-line" masking register used immediately to implement the writing phase.

If compared with the known solution, the masking register of this solution may provide various advantages, since the reading register may be obtained as output of the sense amplifiers while the writing register includes the codeword to be written.

At this point, a ramped cell programming bias may be applied to the memory cells. By applying a raising biasing voltage, the bit by bit programming phase may be stopped as soon as a cell has reached its specific threshold value passing to the subsequent cell. On the contrary, if a single programming pulse (for instance like the one shown in the left diagram of FIG. 9) may be applied, the cells having the lower threshold would be stressed much more. The programming phase means a double step program plus verify. Therefore, each cell may be programmed and sensed so that if it has not been well programmed, an extra programming pulse may be applied up to the moment of its switching to the desired logic value.

In a very negative situation wherein the whole program plus verify algorithm has still given a negative report about the switching of a memory cell, it may be foreseen a final series of blind pulses in the sense that they do not require a verify but try to force the desired logic value in that cells. Since the cells may be masked during the programming phase, there will be a maximum voltage value that could be applied to a cell during the writing phase. If the programming phase has been completed but there is still some (or only one) lazy cells not willing to switch, there may be substantially two options: to flag an error, or to apply some extra pulses with a voltage value higher than the maximum standard voltage. However, the final extra pulses may be not verified. Any verify cycle may take few milliseconds to be completed. However, this possible drawback may happen very rarely and may involve one or two bits at the maximum. To about 99% of the regular bits, a relatively low biasing voltage has been applied.

It should be noted that according to the number of "1s" or "0s" contained in a codeword, it could be more convenient to mask the cells having a logic value "1" or a logic value "0". Therefore, two counters may be used, CNT1 including the number of "1s" and CNT0 including the number of "0s". The two different values may be kept, since bits that impede obtaining the number of bits with a logic value from the number of the other bits have been masked. The total number of bits may be given by "0" bits plus "1" bits plus masked bits. Since there are three variables, at least two records may be provided to get the total number of bits.

Afterwards, the subsequent actions may be performed. For instance, the logic value "0" may be programmed followed by programming the logic value "1", which is the write sequence WS1 that may be used if the number of the logic value "0" is greater. As an alternative, the write sequence WS2 may be performed, and wherein the logic value "1" may be programmed followed by programming the logic value "0", if the number of the logic value "1" is greater. A third kind of write sequence WS3 may be applied only if there is only one bit per tile to be programmed, and this is a specific case for which a parallel programming may be applied. In a tile, the bits may share the same wordline, but opposite polarities may be provided for the pulse for the logic value "0" and the pulse for the logic value "1". Therefore, if there is a bit per tile (and in different tiles), the logic values "0" and "1" can even be programmed at the same time (in parallel), since in the tile where the logic value "1" is to be written, a polarity can be applied while the opposite polarity may be applied in the tile where 0 is to be written. On the contrary, if there are more bits per tile, i.e. more bits sharing the same wordline, the logic values "0" and "1" cannot be programmed in parallel, since that wordline may have a single voltage value in a time.

In other words, the logic value "0" may be programmed with a certain polarity and, at the end of the programming phase of the logic value "0", the logic value "1" may be programmed with a opposite polarity, and vice versa. As alternative, if the logic values "0" and "1" are in bits physically separated in different tiles, they can even be programmed in parallel with different polarities.

However, there may be a risk to have stuck cells pushing voltages too high during the programming phase. In this case, a verify phase may be performed immediately after the programming phase to avoid stressing the cells. It may be called as on-the-fly programming and verifying, which also means on-line. Moreover, it should be noted that the write sequence of the proposed solution is based on the ECC feedback and on the counters. The ECC may be used to solve the problem of stressing too much the stuck cells. If, from the ECC, the information is obtained that the programming phase is current unless one single bit, then the codeword has been programmed at a reasonable voltage level and only one final bit could be subject to an extra programming pulse. In any case, the output codeword would be reparable.

In some examples, the use of a counter based writing algorithm with ECC feedback enables the opportunity to verify the written program pattern, which may save time and power consumption and increase reliability. In some examples, no additional time is used to perform verify, average voltage program may be reduced, and the less disturb and the more cycles may provide increased reliability.

Features of the disclosure introduced above are further described below in the context of a memory array in a memory device. Specific non-limiting examples are then described for illustrating various features of the on-the-fly programming and verifying method for memory cells based on counters and ECC feedback in accordance with some examples (e.g., the memory array including PCM cells or three-dimensional cross-point (e.g., 3D XPoint) memory cells, chalcogenide-based memory cells, etc.). These and other features of the disclosure are further illustrated by and described with reference to apparatus diagrams, system diagrams, and flowcharts that relate to the on-the-fly programming and verifying method for memory cells based on counters and ECC feedback. As a person of ordinary skill in the art would appreciate, however, other alternatives and different variations may be considered and fall within the scope of this disclosure.

FIG. 1 illustrates an example memory device 100 in accordance with examples of the present disclosure. Memory device 100 may also be referred to as an electronic memory apparatus. FIG. 1 is an illustrative representation of various components and features of the memory device 100. As such, it should be appreciated that the components and features of the memory device 100 shown to illustrate functional interrelationships, and may not be representative of their actual physical positions within the memory device 100. In the illustrative example of FIG. 1, the memory device 100 includes a 3D memory array 102. The 3D memory array 102 includes memory cells 105 that may be programmable to store different states. In some examples, each memory cell 105 may be programmable to store two states, denoted as a logic 0 and a logic 1. In some examples, a memory cell 105 may be configured to store more than two logic states. A memory cell 105 may, in some examples, include a PCM cell (e.g., a 3D XPoint memory cell), a chalcogenide-based memory cell, or other types of memory cell. Although some elements included in FIG. 1 are labeled with a numeric indicator, other corresponding elements are not labeled, though they are the same or would be understood to be similar, in an effort to increase visibility and clarity of the depicted features.

The 3D memory array 102 may include two or more two-dimensional (2D) memory arrays formed adjacent one another (e.g., on top of or next to one another). This may increase a number of memory cells 105 that may be placed or created on a single die or substrate as compared with 2D arrays, which in turn may reduce production costs, or increase the performance of the memory device, or both. Based on the example depicted in FIG. 1, the 3D memory array 102 includes two levels of memory cells 105; however, the number of levels may not be limited to two. Each level may be aligned or positioned such that memory cells 105 may be aligned (exactly, overlapping, or approximately) with one another across each level, forming a memory cell stack 145. In some cases, the memory cell stack 145 may include a PCM cell (e.g., 3D XPoint memory cell) laid on top of another.

In some examples, each row of memory cells 105 is connected to an access line 110, and each column of memory cells 105 is connected to a bit line 115. Access lines 110 and bit lines 115 may be substantially perpendicular to one another and may create an array of memory cells. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. In other examples, each of the memory cell 105 (e.g., the upper memory cell, the lower memory cell) may be configured with its own bit line. In such cases, the memory cells may be separated by an insulation layer. Other configurations may be possible, for example, a third layer may share an access line 110 with a lower layer. In general, one memory cell 105 may be located at the intersection of two conductive lines such as an access line 110 and a bit line 115. This intersection may be referred to as a memory cell's address. A target memory cell 105 may be a memory cell 105 located at the intersection of an energized access line 110 and bit line 115; that is, access line 110 and bit line 115 may be energized in order to read or write a memory cell 105 at their intersection. Other memory cells 105 that are in electronic communication with (e.g., connected to) the same access line 110 or bit line 115 may be referred to as untargeted memory cells 105.

Figure 2:
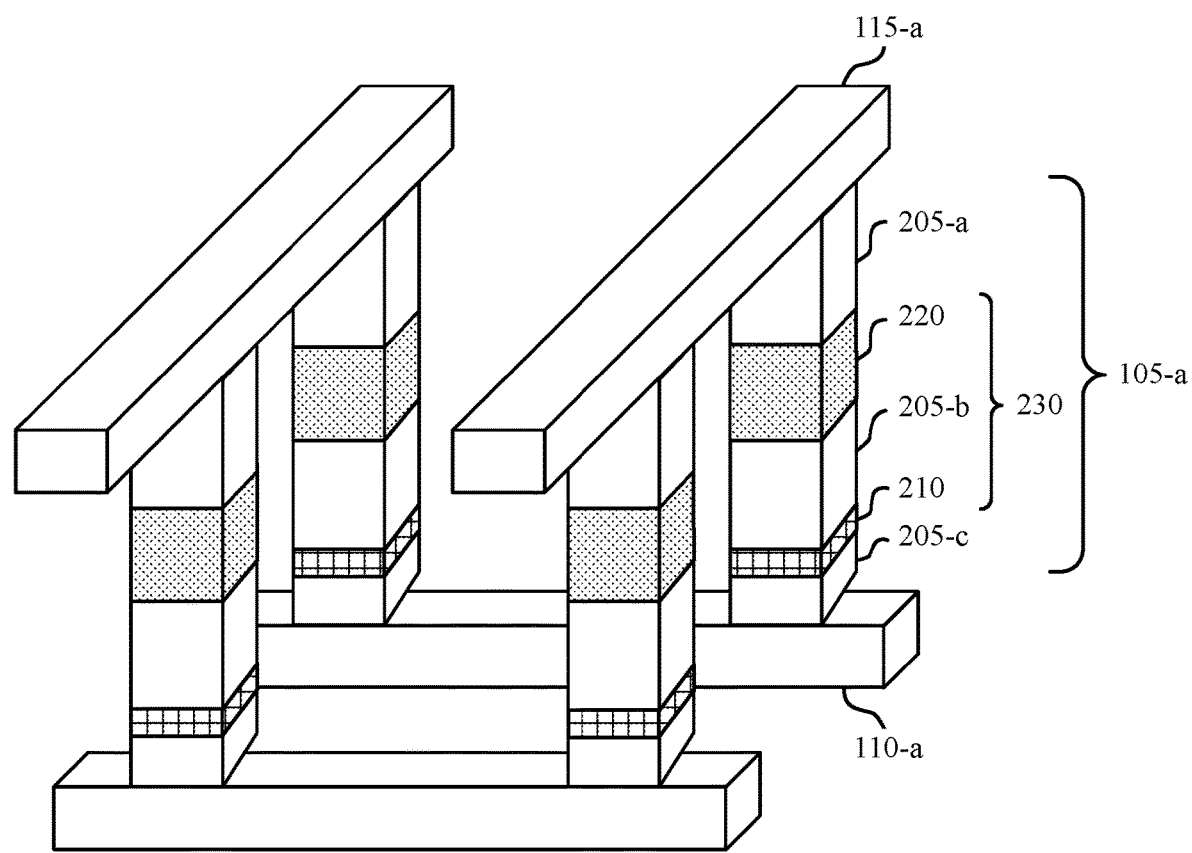
FIG. 2 illustrates an example of a 3D memory array that supports the on-the-fly programming and verifying method for memory cells based on counters and ECC feedback in accordance with examples of the present disclosure.

As discussed above, electrodes may be coupled to a memory cell 105 and an access line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some examples, a memory cell 105 may include a chalcogenide alloy positioned between a first electrode and a second electrode. One side of the first electrode may be coupled to an access line 110 and the other side of the first electrode to the chalcogenide alloy. In addition, one side of the second electrode may be coupled to a bit line 115 and the other side of the second electrode to the chalcogenide alloy. The first electrode and the second electrode may be the same material (e.g., carbon) or different. In other examples, the memory cell 105 may include an additional electrode to separate the chalcogenide alloy into two parts as depicted in FIG. 2. A first part of the chalcogenide alloy may have a different composition than a second part of the chalcogenide alloy. In some examples, the first part of the chalcogenide alloy may have a different function than the second part of the chalcogenide alloy. The additional electrode may be the same material (e.g., carbon) or different than the first electrode and/or the second electrode.

Operations such as reading and writing may be performed on memory cells 105 by energizing or selecting access line 110 and digit line 115. In some examples, access lines 110 may also be known as word lines 110, and bit lines 115 may also be known as digit lines 115. References to word lines and bit lines, or their analogues, are interchangeable without loss of understanding or operation. Energizing or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

In some architectures, the logic storing device of a memory cell 105 (e.g., a capacitor, a resistor) may be electrically isolated from the digit line 115 by a selection component. The word line 110 may be connected to and may control the selection component. For example, the selection component may be a transistor and the word line 110 may be connected to the gate of the transistor. Energizing the word line 110 results in an electrical connection or closed circuit between the logic storing device of a memory cell 105 and its corresponding digit line 115. The digit line 115 may then be accessed to either read or write the memory cell 105.

Upon selecting a memory cell 105, the resulting signal may be used to determine the stored logic state. In some cases, a first logic state may correspond to no current or a negligibly small current, whereas a second logic state may correspond to a finite amount of current. In some cases, a memory cell 105 may include a 3D XPoint memory cell or a self-selecting memory (SSM) cell, both having two terminals and may not use a separate selection component. As such, one terminal of the 3D XPoint memory cell or the SSM cell may be electrically connected to a word line 110 and the other terminal of the 3D) (Point memory cell or the SSM cell may be electrically connected to a digit line 115.

Accessing memory cells 105 may be controlled through a row decoder 120 and a column decoder 130. For example, a row decoder 120 may receive a row address from the memory controller 140 and energize the appropriate word line 110 based on the received row address. Similarly, a column decoder 130 may receive a column address from the memory controller 140 and energize the appropriate digit line 115. For example, the 3D memory array 102 may include multiple word lines 110, labeled WL_B1 (or WL_T1) through WL_BM (or WL_TM), and multiple digit lines 115, labeled DL_1 through DL_N, where M and N depend on the array size. Thus, by energizing a word line 110 and a digit line 115, e.g., WL_B2 and DL_3, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected (e.g., a memory cell 105 turns on, switches on, conducts current, or becomes activated). In other cases, predetermined voltages may be applied sequentially until a current is detected. Likewise, a current may be applied to a memory cell 105 and the magnitude of the voltage to create the current may depend on the electrical resistance or the threshold voltage of the memory cell 105.

Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. FIG. 1 also shows an alternative option of arranging the sense component 125-a (in a dashed box). An ordinary person skilled in the art would appreciate that sense component may be associated either with column decoder or row decoder without losing its functional purposes.

A memory cell 105 may be set or written by similarly energizing the relevant word line 110 and digit line 115 and at least one logic value may be stored in the memory cell 105. Column decoder 130 or row decoder 120 may accept data, for example input/output 135, to be written to one or more memory cells 105.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, energizing a single word line 110 may result in the discharge of all memory cells 105 in the row; thus, several or all memory cells 105 in the row may need to be re-written. But in non-volatile memory, such as SSM, PCM (e.g., 3D XPoint memory), FeRAM, or 3D NAND memory, accessing the memory cell 105 may not destroy the logic state and, thus, the memory cell 105 may not require re-writing after accessing.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to energize the desired word line 110 and digit line 115. Memory controller 140 may also generate and control various voltages or currents used during the operation of memory device 100.

The memory controller 140 may receive user data through the input/output 135. In some examples, the memory controller 140 may read a previous user data from the memory cells and write a new user data and merge the new user data with the previous user data into write registers. Then, a mask register (MR) information may be generated, and wherein the mask register information may indicate bits of the previous user data stored in the memory cells to be switched or not to be switched in their logic values. In some examples, the memory controller 140 may count numbers of a first logic value (logic "0") and a second logic value (logic "1") to be written using the MR information, respectively, and store the numbers of the first logic value and the second logic value into a first counter and a second counter, respectively. In some examples, the memory controller 140 may apply a programming pulse to the memory cells according to the mask register information.

In general, the amplitude, shape, polarity, and/or duration of an applied voltage or current discussed herein may be adjusted or varied and may be different for the various operations discussed in operating the memory device 100. Furthermore, one, multiple, or all memory cells 105 within memory array 102 may be accessed simultaneously; for example, multiple or all cells of memory array 102 may be accessed simultaneously during a reset operation in which all memory cells 105, or a group of memory cells 105, are set to a single logic state.

FIG. 2 illustrates an example of a memory array 200 that supports the on-the-fly programming and verifying method for memory cells based on counters and ECC feedback in accordance with examples of the present disclosure. Memory array 200 may be an example of portions of memory array 102 described with reference to FIG. 1. As depicted in FIG. 2, memory array 200 includes multiple materials to construct a memory cell 105-a. Each memory cell 105-a is stacked in a vertical direction (e.g., perpendicular to a substrate) to create memory cell stacks (e.g., the memory cell stack 145). The memory cell 105-a may be an example of a memory cell 105 described with reference to FIG. 1. Memory array 200 may thus be referred to as a 3D memory array. The architecture of memory array 200 may be referred to as a cross-point architecture. Although some elements included in FIG. 2 are labeled with a numeric indicator, other corresponding elements are not labeled, though they are the same or would be understood to be similar, in an effort to increase visibility and clarity of the depicted features.

Memory array 200 also includes word lines 110-*a* and bit lines 115-*a*, which may be examples of word lines 110 and bit lines 115 described with reference to FIG. 1. Illustration of the materials between the word lines 110-*a* and the bit lines 115-*a* depicted in FIG. 2 may represent a lower portion of the memory cell 105 in FIG. 1. Memory array 200 includes electrodes 205, logic storage elements 210, selector device elements 220, and a substrate 225. The logic storage element 210, electrode 205-*b*, and selector device element 220 may be referred to collectively as a memory element 230. In some examples, a single component including a chalcogenide alloy (not shown, replacing selector device element 220, logic storage element 210, and electrode 205-*b* as the memory element 230) may act as both a logic storage element and a selector device. Electrode 205-*a* may be in electronic communication with bit line 115-*a* and electrode 205-*c* may be in electronic communication with word line 110-*a*.

Insulating materials depicted as empty spaces may be both electrically and thermally insulating. As described above, in PCM technology, various logic states may be stored by varying the electrical resistance of the logic storage element 210 in memory cells 105-*a*, which in turn exhibiting varying threshold voltages of the memory cells 105-*a*. In some cases, storing various logic states includes passing a current through the memory cell 105-*a*, heating the logic storage element 210 in memory cell 105-*a*, or melting (e.g., wholly or partially) the material of the logic storage element 210 in memory cell 105-*a*. Other storage mechanisms, such as threshold voltage modulation, may be exploited in chalcogenide-based memories.

In some cases, memory array 200 may include an array of memory cell stacks, and each memory cell stack may include multiple memory cells 105-*a*. Memory array 200 may be made by forming a stack of conductive materials, such as word lines 110-*a*, in which each conductive material is separated from an adjacent conductive material by electrically insulating materials in between. The electrically insulating materials may include oxide or nitride materials, such as silicon oxide, silicon nitride, or other electrically insulating materials. These materials may be formed above the substrate 225, such as a silicon wafer, or any other semiconductor or oxide substrate. Subsequently, various process steps may be utilized to form the materials in between the word lines 110-*a* and bit lines 115-*a* such that each memory cell 105-*a* may be coupled with a word line 110-*a* and a bit line 115-*a*.

The selector device element 220 may be connected with the logic storage element 210 through electrode 205-*b*. In some examples, the positioning of the selector device element 220 and the logic storage element 210 may be flipped. The composite stack including the selector device element 220, the electrode 205-*b*, and the logic storage element 210 may be connected to a word line 110-*a* through the electrode 205-*c* and to a bit line 115-*b* through the electrode 205-*a*. The selector device element 220 may aid in selecting a particular memory cell 105-*a* or may help prevent stray currents from flowing through non-selected memory cells 105-*a* adjacent to a selected memory cell 105-*a*. The selector device element 220 may include an electrically non-linear component (e.g., a non-Ohmic component) such as a metal-insulator-metal (MIM) junction, an Ovonic threshold switch (OTS), or a metal-semiconductor-metal (MSM) switch, among other types of two-terminal selector device such as a diode. In some cases, the selector device element includes a chalcogenide alloy. The selector device, in some examples, include an alloy of selenium (Se), arsenic (As), silicon (Si), and germanium (Ge).

As discussed above, memory cells 105-*a* of FIG. 2 may include a material with a variable resistance. Variable resistance materials may refer to various material systems, including, for example, metal oxides, chalcogenides, and the like. Chalcogenide materials are materials or alloys that include at least one of the elements sulfur (S), tellurium (Te), or selenium (Se). Many chalcogenide alloys may be possible—for example, a germanium-antimony-tellurium alloy (Ge—Sb—Te) is a chalcogenide material. Other chalcogenide alloys not expressly recited here may also be employed.

To set a low-resistance state, a memory cell 105-*a* may be heated by passing a current through the memory cell 105-*a*. Heating caused by electrical current flowing through a material that has a finite resistance may be referred to as Joule or Ohmic heating. Joule heating may thus be related to the electrical resistance of the electrodes or the phase change material. Heating the phase change material to an elevated temperature (but below its melting temperature) may result in the phase change material crystallizing and forming the low-resistance state. In some cases, a memory cell 105-*a* may be heated by means other than Joule heating, for example, by using a laser. To set a high-resistance state, the phase change material may be heated above its melting temperature, for example, by Joule heating. The amorphous structure of the molten material may be quenched, or locked in, by abruptly removing the applied current to quickly cool the phase change material.

In some cases, memory cells 105-*a* may exhibit different electrical characteristics after a number of cycling operations (e.g., a series of read or write operations). For example, a threshold voltage of a memory cell 105-*a* (e.g., PCM cell) corresponding to a logic state of 1, after receiving an identical programming pulse to store the logic state of 1 (e.g., a SET programming pulse), may be different if a memory cell 105-*a* is relatively new (e.g., a PCM cell with a small number of read or write operations) compared to a memory cell 105-*a* having been cycled through an extensive number of read or write operations. In addition, in some cases, a chalcogenide material in the memory cells 105-*a* (e.g., the logic storage element 210) may experience a change (which may also be referred to as a drift) in its resistance after programming (e.g., crystallizing or quenching) of the chalcogenide material during a write operation. Such change in resistance may result in changes in threshold voltages of memory cells 105-*a* and may hinder accurately reading information from memory cells 105-*a* (e.g., PCM cells) after a certain period of time elapsed. In some examples, the amount of change may be a function of an ambient temperature.

In some examples, the memory cells 105-*a* may be configured to store encoded user data that include modified user data (or original user data, in some cases) and a number of parity bits, which may be added thereto. In some cases, the encoded user data stored in the memory cells 105-*a* have been modified to include a predetermined number of bits having the logic state of 1. The number of bits having the logic state of 1 may be different depending on encoding scheme employed. In some cases, the number of bits having the logic state of 1 may be 50% (or other percentage) of the bits containing the encoded user data. In some examples, the memory cells 105-a may be configured to store user data while an additional set of memory cells 105-a is configured to store a counting information. The counting information may represent a number of bits in the user data having the logic state of 1. In some cases, the counting information may be read in advance to extract the number of bits in the user data having the logic state of 1 before the user data are read. Additionally or alternatively, the counting information may be determined while the user data are being read.

Some examples of memory cells may include a memory element and a select device and other examples of memory cells may include a memory element that is selected using techniques that do not include a select device. In some examples, a memory cell 105-a including a chalcogenide material may be programmed or read using polarity dependent signals (e.g., a self-selecting memory cell). In such examples, a memory cell 105-a may be programmed to a logic state by applying a first signal having a first voltage and a first polarity. When a particular memory cell 105-a is programmed using the first signal, elements within the memory cell may separate, causing ion migration. Ions may migrate towards a particular electrode 205, depending on the polarity of the first signal applied to the memory element. For example, ions in a memory cell 105-a may migrate towards a first electrode when a signal having a first polarity is used and may migrate towards a second electrode when a signal having a second polarity is used. The first polarity of a signal may refer to a signal that has a current that flows in a first direction across the memory cell (e.g., from a second electrode to a first electrode). The second polarity of a signal may refer to a signal that has a current that flows in a second direction across the memory cell different than the first direction (e.g., from a first electrode to a second electrode).

The memory cell may be read by applying a read signal across the memory cell. The threshold voltage seen during a read operation may be based on the distribution of ions in the memory cell, the polarity of the read signal, and/or the polarity of the programming signal. For example, if a memory cell has a given distribution based on a programming signal used to program the memory cell, the threshold voltage detected during the read operation may be different when a first read signal with a first polarity is used than when a second read signal having a second polarity is used. Depending on the polarity of the memory cell, this concentration of migrating ions may represent a logic "1" or logic "0" state. The description of ion migration represents an example of a mechanism of the memory cell for achieving the results described herein.

In some examples, such as for thresholding memory cells or self-selecting memory cells, some or all of the set of logic states supported by the memory cells may be associated with an amorphous state of the chalcogenide material (e.g., the material in a single state may be operable to store different logic states). The material used in the memory element 230 may be based on an alloy (such as the alloys listed herein) and may be operated so as to undergo a change to a different physical state during normal operation of the memory cell. For example, a memory cell may have a high threshold voltage state that may correspond to a first logic state (e.g., a RESET state) and a low threshold voltage state that may correspond to a second logic state (e.g., a SET state).

During a programming (write) operation of a memory cell (e.g., including electrode 205-a, memory element 230, and electrode 205-c), a polarity used for a write operation may influence (e.g., determine, set, program) a particular behavior or characteristic of the material of the memory element 230, such as the threshold voltage of the material. The difference in threshold voltages of the material of the memory element 230 depending on the logic state stored by the material of the memory element 230 (e.g., the difference between the threshold voltage when the material is storing a logic state '0' versus a logic state '1') may correspond to the read window of the memory element 230.

In some examples, the memory device may include multiple arrays or decks, stacked on each other. For example, the memory device may include a first array or deck of memory cells (e.g., array 200) that is positioned above a substrate 225 and a second array or deck of memory cells (not shown) on top of the first array or deck 200. Memory cells of each deck 200 may each include a first electrode 205-c, a memory element 230 (e.g., including chalcogenide material), and a second electrode 205-a that may form a memory stack. The memory stacks may also include other layers and materials. The memory cells of the first deck and the second deck may, in some examples, have common conductive lines, such that corresponding memory cells of each deck may share bit lines 115 or word lines 110 as described with reference to FIG. 1. For example, bit line 115-a may be shared by vertically adjacent memory cells. In some cases, the memory cells 105-a may be examples of phase-change memory cells or self-selecting memory cells.

The architecture of memory array 200 may be referred to as a cross-point architecture, in which a memory cell is formed at a topological cross-point between a word line and a bit line. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector component. For example, DRAM may use a transistor, which is a three-terminal device, as the selector component for each memory cell and may have a larger memory cell area compared to the cross-point architecture.

In some examples, one or more of the memory decks may include a memory element 230 that includes chalcogenide material. The memory element 230 may, for example, include a chalcogenide glass such as, for example, an alloy of selenium (Se), tellurium (Te), arsenic (As), antimony (Sb), carbon (C), germanium (Ge), and silicon (Si). In some examples, a chalcogenide material having primarily Se, As, and Ge may be referred to as SAG-alloy. In some examples, SAG-alloy may include Si and such chalcogenide material may be referred to as SiSAG-alloy. In some examples, the chalcogenide glass may include additional elements such as hydrogen (H), oxygen (O), nitrogen (N), chlorine (Cl), or fluorine (F), each in atomic or molecular forms.

Several examples will be described below in the context of self-selecting (SSM) and/or 3D cross-point (e.g., 3D XPoint) memory cell devices, e.g., with reference to FIGS. 4 to 11; however, the same principles and solutions may be implemented in the context of ferroelectrics (FeRAM) devices, the basic functioning of which is described in FIGS. 3A and 3B, with the appropriate adjustments.

Figure 3A:
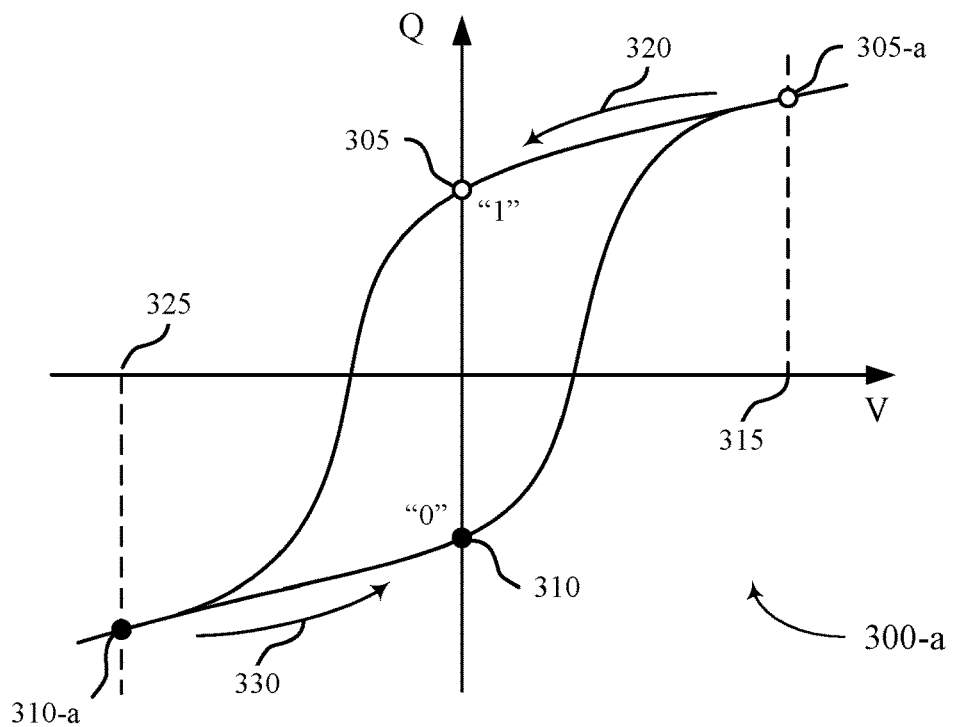
FIGS. 3A and 3B illustrate examples of hysteresis curves that support the on-the-fly programming and verifying method for memory cells based on counters and ECC feedback in accordance with examples of the present disclosure.
Figure 3B:
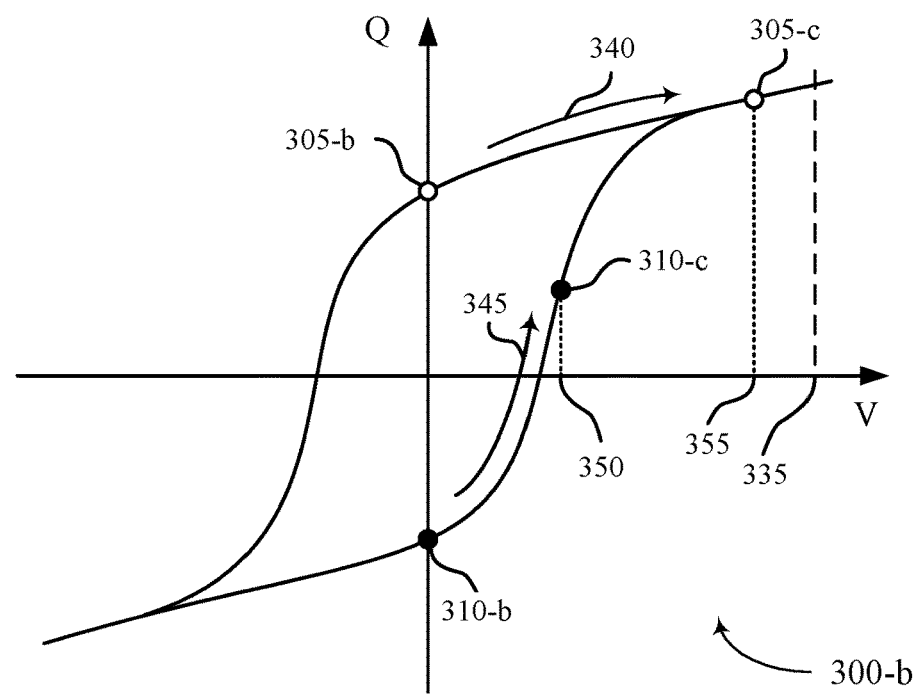

FIGS. 3A and 3B illustrate examples of non-linear electrical properties of a ferroelectric memory cell with hysteresis curves 300-a and 300-b in accordance with various examples as disclosed herein. Hysteresis curves 300-a and 300-b illustrate an example ferroelectric memory cell writing and reading process, respectively. Hysteresis curves 300-*a* and 300-*b* depict the charge, Q, stored on a ferroelectric capacitor as a function of a voltage difference, V.

A ferroelectric material is characterized by a spontaneous electric polarization, that is, it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations.

Hysteresis curves 300-*a* and 300-*b* may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, the voltages in hysteresis curves 300-*a* and 300-*b* represent a voltage difference across the capacitor and are directional. For example, a positive voltage may be realized by applying a positive voltage to the terminal in question (e.g., a cell plate) and maintaining the second terminal (e.g., a cell bottom) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-*a* and 300-*b*.

As depicted in hysteresis curve 300-*a*, the ferroelectric material may maintain a positive or negative polarization with a zero-voltage difference, resulting in two possible charged states: a charge state 305 and a charge state 310. According to the examples of FIGS. 3A and 3B, charge state 305 represents a logic 1 and charge state 310 represents a logic 0. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-*a* is reached. Upon removing voltage 315, charge state 305-*a* follows path 320 until it reaches charge state 305 at zero voltage. Similarly, charge state 310 is written by applying a net negative voltage 325, which results in charge state 310-*a*. After removing negative voltage 325, charge state 310-*a* follows path 330 until it reaches charge state 310 at zero voltage. Charge states 305-*a* and 310-*a* may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-*b* or 310-*b* was initially stored. For example, hysteresis curve 300-*b* illustrates two possible stored charge states 305-*b* and 310-*b*. Voltage 335 may be applied across the capacitor. In other cases, a fixed voltage may be applied to the cell plate and, although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on one or more factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. A voltage measured at a sense component may not equal voltage 335 and instead may depend on the voltage of the digit line. The position of final charge states 305-*c* and 310-*c* on hysteresis curve 300-*b* may thus depend on the capacitance of the digit line and may be determined through a load-line analysis—i.e., charge states 305-*c* and 310-*c* may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., the difference between the voltage 335 and the voltage 350 or the different between the voltage 335 and the voltage 355. A reference voltage may be generated such that its magnitude is between the two possible voltages of the two possible digit line voltages to determine the stored logic state—i.e., if the digit line voltage is higher or lower than the reference voltage. Upon comparison by the sense component, the sensed digit line voltage may be determined to be higher or lower than the reference voltage, and the stored logic value of the ferroelectric memory cell (i.e., a logic 1 or 0) may be determined. As it is apparent from the description above, the logic value assigned to a memory cells not only depends on the digit line voltage, but also on the reference voltage used in the comparison. Independently of how accurately and precisely the reference voltage is selected and generated, there are cases in which it is not reliable (and even not possible) to carry out a reading operation with a sole reference voltage for all memory cells.

In some cases, a ferroelectric memory cell may maintain the initial logic state after a read operation. For example, if charge state 305-*b* is stored, the charge state may follow path 340 to charge state 305-*c* during a read operation and, after removing voltage 335, the charge state may return to initial charge state 305-*b* by following path 340 in the opposite direction. In some cases, a ferroelectric memory cell may lose its initial logic state after a read operation. For example, if charge state 310-*b* is stored, the charge state may follow path 345 to charge state 305-*c* during a read operation and, after removing voltage 335, the charge state may relax to the charge state 305-b by following path 340.

Figure 4:
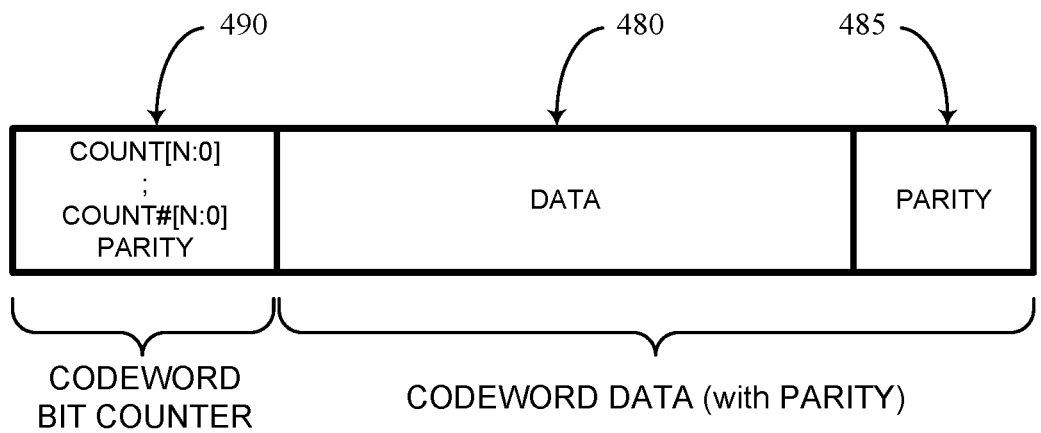
FIG. 4 illustrates an example of a codeword of a memory array that supports the on-the-fly programming and verifying method for memory cells based on counters and ECC feedback in accordance with examples of the present disclosure.

FIG. 4 illustrates an example of a codeword of a memory array that supports the on-the-fly programming and verifying method for memory cells based on counters and ECC feedback in accordance with examples of the present disclosure. A codeword 400 of a memory device, such as the memory device 100 of FIG. 1, may comprise a DATA region 480 for storing the codeword data and an optional PARITY region 485, possibly comprising parity data associated to the codeword data. The parity data may be error correction parity bits, in some examples.

Associated with the DATA 480 and the PARITY 485 is provided a CODEWORD BIT COUNTER region 490 for storing a number of bits of DATA 480 and PARITY 485 in a predefined logic state. The number of bits in the bit counter region (COUNT[N:0]) depends on the total DATA 480 and PARITY 485 bit count and the particular encoding used. Each bit counter bit (COUNT[N:0]) may be also stored with its false value (COUNT #[N:0]), to improve reliability of the information therein. The CODEWORD BIT COUNTER 490 bits may be stored with a different arrangement, for example a majority voting arrangement. It may further be protected by error correction, in some examples.

When data is received at input terminals for programming in the memory, the memory controller analyzes the data and determines the encoding to be applied and finally determines a number of bits in the predefined state (e.g., how many bits are stored in the memory cells as a logic 1 state, for example).

The information stored in the CODEWORD BIT COUNTER 490 regions is used during a subsequent access operation to retrieve the codeword data, as it will be explained in detail below.

Figure 5:
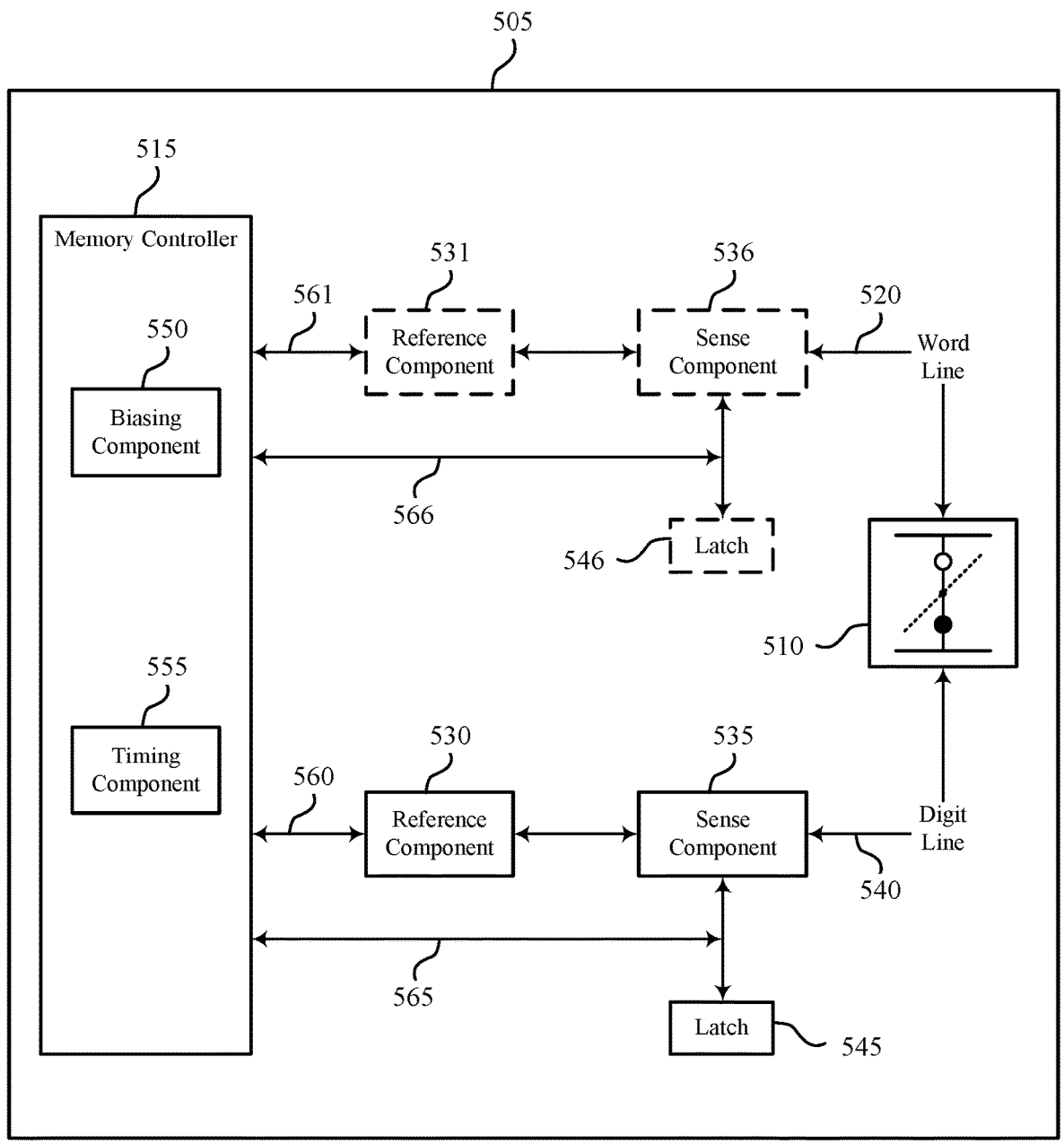
FIG. 5 illustrates a block diagram of a device that supports the on-the-fly programming and verifying method for memory cells based on counters and ECC feedback in accordance with examples of the present disclosure.

FIG. 5 shows a block diagram 500 of a memory array 505 that supports the on-the-fly programming and verifying method for memory cells based on counters and ECC feedback in accordance with examples of the present disclosure. The memory array 505 may be referred to as an electronic memory apparatus and may be an example of a component of a memory device as described herein.

The memory array 505 may include one or more memory cells 510, a memory controller 515, a word line 520, a reference component 530, a sense component 535, a digit line 540, and a latch 545. These components may be in electronic communication with each other and may perform one or more of the functions described herein. In some cases, the memory cells 510 may include 3DXP memory cells. In some aspects, the memory controller 515 may include a biasing component 550 and a timing component 555. In some examples, a sense component 535 may serve as the reference component 530. In other cases, the reference component 530 may be optional.

The memory controller 515 may be in electronic communication with the word line 520, the digit line 540, and the sense component 535, which may be examples of the word line 110, the digit line 115, and the sense component 125 described with reference to FIGS. 1 and 2. The components of the memory array 505 may be in electronic communication with each other and may perform aspects of the functions described with reference to FIGS. 3 and 4. In some cases, the reference component 530, the sense component 535, and the latch 545 may be components of the memory controller 515.

In some examples, the digit line 540 is in electronic communication with the sense component 535 and a memory cell 510. The memory cell 510 may be writable with a logic state (e.g., a first, second, or third logic state). The word line 520 may be in electronic communication with the memory controller 515 and the memory cell 510. The sense component 535 may be in electronic communication with the memory controller 515, the digit line 540, the latch 545, and the reference line 560. The reference component 530 may be in electronic communication with the memory controller 515 and the reference line 560. A sense control line 565 may be in electronic communication with the sense component 535 and the memory controller 515. These components may also be in electronic communication with other components, both inside and outside of the memory array 505, in addition to components not listed above, via other components, connections, or buses.

The memory controller 515 may be configured to energize the word line 520 or the digit line 540 by applying voltages to those various nodes. For example, the biasing component 550 may be configured to apply a voltage to operate the memory cell 510 to read or write the memory cell 510 as described above. In some cases, the memory controller 515 may include a row decoder, a column decoder, or both, as described herein. This may enable the memory controller 515 to access one or more memory cells 105 as illustrated with reference to FIG. 1. The biasing component 550 may also provide voltage to the reference component 530 in order to generate a reference signal for the sense component 535. Additionally, the biasing component 550 may provide voltages for the operation of the sense component 535.

In some examples, the memory controller 515 may perform its operations using the timing component 555. For example, the timing component 555 may control the timing of the various word line selections or bit line biasing, including timing for switching and voltage application to perform the memory functions, such as reading and writing, discussed herein. In some cases, the timing component 555 may control the operations of the biasing component 550.

The reference component 530 may include various components to generate a reference signal for the sense component 535. The reference component 530 may include circuitry configured to produce a reference signal. In some cases, the reference component 530 may be implemented using other 3D XPoint memory cells. The sense component 535 may compare a signal from the memory cell 510 (through the digit line 540) with a reference signal from the reference component 530. Upon determining the logic state, the sense component may then store the output in the latch 545, where it may be used in accordance with the operations of an electronic device that the memory array 505 is a part. The sense component 535 may include a sense amplifier in electronic communication with the latch 545 and the memory cell 510.

The memory controller 515 and/or at least some of its various sub-components may be implemented in hardware, software executed by a processor, firmware, or any combination thereof. If implemented in software executed by a processor, the functions of the memory controller 515 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The memory controller 515 and/or at least some of its various sub-components may be physically located at various positions, including being distributed such that portions of functions are implemented at different physical locations by one or more physical devices. In some examples, the memory controller 515 and/or at least some of its various sub-components may be a separate and distinct component in accordance with various examples of the present disclosure. In other examples, the memory controller 515 and/or at least some of its various sub-components may be combined with one or more other hardware components, including but not limited to an I/O component, a transceiver, a network server, another computing device, one or more other components described in the present disclosure, or a combination thereof in accordance with various examples of the present disclosure.

Figure 6:
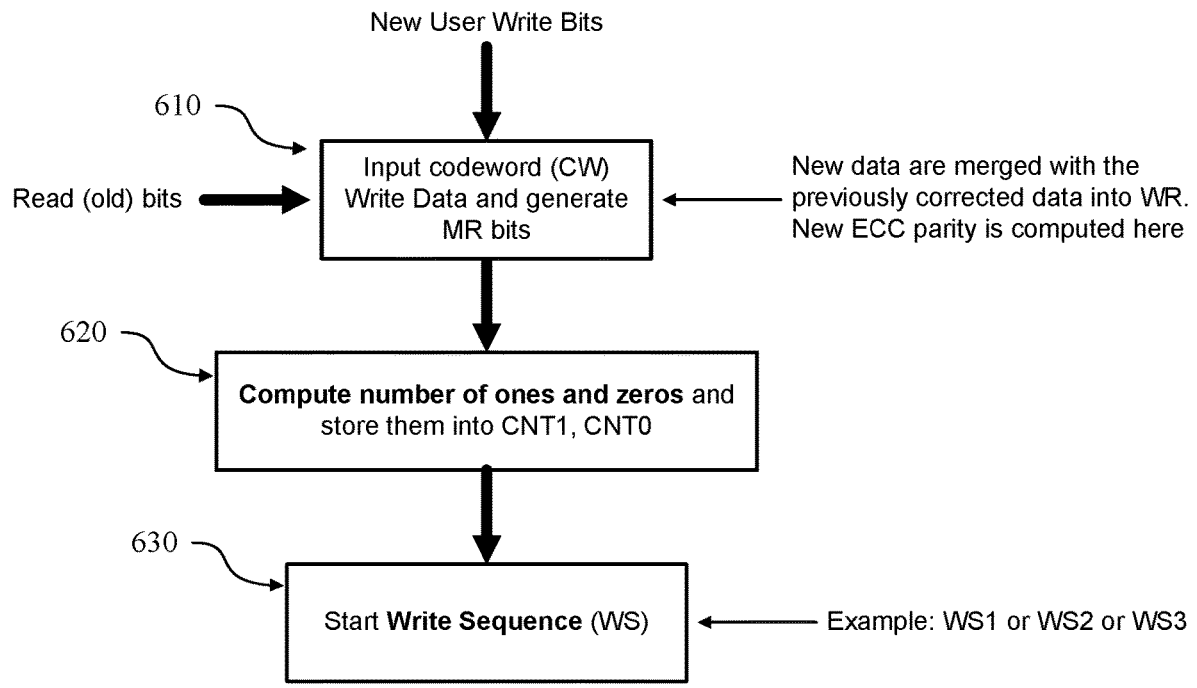
FIG. 6 illustrates a block diagram of the programming phase preparing the memory device of the present disclosure for operating according to the disclosed method.

FIG. 6 shows a schematic flow chart reporting the sequence of actions that are performed during the programming phase.

The first input action is represented by the block 610 wherein the programming algorithm takes care of the input write data. The new data are merged with the previously corrected data in a register. The new ECC parity bit is computed in this phase. The old codeword is read from the memory cells and the sequence of the write data allows obtaining a new mask register that serves to identify the bits of the already store sequence that do not need to be re-programmed since their logic value already correspond to the logic value of the corresponding bit of the new codeword to be written.

The algorithm proceeds with the computation of the number of ones and zeros and storing them into counters, CNT1 and CNT0, respectively, in block 620.

Then, in block 630, a writing sequence may start. For instance, the logic value "0" may be programmed followed by programming the logic value "1", which is the sequence WS1 that may be used if the number of the logic value "0" is greater. As an alternative, the sequence WS2 may be performed, and wherein the logic value "1" may be programmed followed by programming the logic value "0", if the number of the logic value "1" is greater. A third kind of sequence WS3 may be applied only if there is only one bit per tile to be programmed, and this is a specific case for which a parallel programming may be applied. In a tile, the bits may share the same wordline, but opposite polarities may be provided for the pulse for the logic value "0" and the pulse for the logic value "1". Therefore, if there is a bit per tile (and in different tiles), the logic values "0" and "1" can even be programmed at the same time (in parallel), since in the tile where the logic value "1" is to be written, a polarity can be applied while the opposite polarity will be applied in the tile where 0 is to be written. On the contrary, if there are more bits per tile, i.e. more bits sharing the same wordline, the logic values "0" and "1" cannot be programmed in parallel, since that wordline may have a single voltage value in a time.

Figure 7:
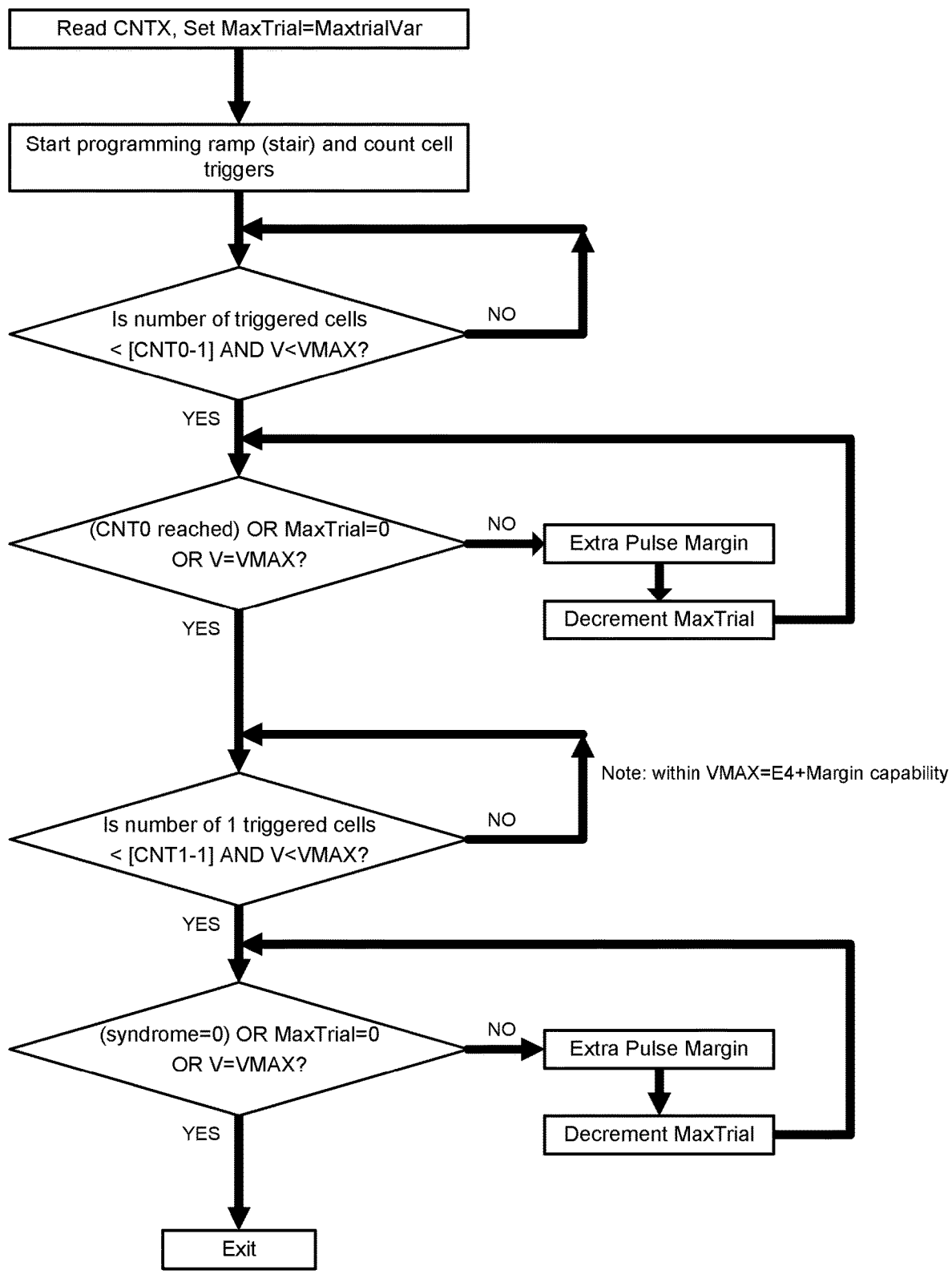
FIG. 7 illustrates an example of the on-the-fly programming and verifying method for memory cells based on counters and ECC feedback in accordance with examples of the present disclosure.

FIG. 7 illustrates a write sequence try and repeat algorithm with ECC1. In the illustrated example, CNTX=CNT1 (for the logic value "1") or CNT0 (for the logic value "0"), MaxTrial=max number of re-pulse, ECC syndrome is feedback to the programming logic to check for errors. In some examples, if the logic value "1" is programmed, the logic value "0" is in the idle state, and vice versa. In some examples, once the switch is detected, the cell is connected to the idle voltage.

First of all, the counters are set, as well as the variable concerning the maximum number of attempts that are allowed. Then the programming ramp is started, according to one or the other of the sequence WS1 or WS2, therefore according to the up or down voltage value to be applied.

Up to the moment wherein there are a number of programmed cells equal to the number of the counter minus 1 (where minus 1 is to be intended as the correcting power of the ECC), then a correctly programmed codeword hasn't been obtained, i.e. a codeword that the ECC is capable to correct. So, the cycle proceeds up to the value CNT−1 (while at the same time a further check is performed on the upper value of the biasing voltage that shall remain under Vmax).

Two verifying steps may be performed during this cycle. If the logic values "0" are being programmed first, the ECC may return a wrong value, for instance, a false positive. Since the logic values "1" have not yet been programmed and if an indication concerning the fact that the codeword is correct is obtained from the ECC, there may be many errors due to the fact that the logic values "1" have not yet been programmed and when an ECC has as input a codeword with many errors the reported result may be wrong as well. Therefore, it is not worthwhile demanding a feedback to the ECC but from the counter. If the logic values "1" are being programmed, it is better demanding if it has been reached that the syndrome "0" that is the condition wherein the codeword has no failure.

On the contrary, if the logic values "0" are being programmed, it can be at the maximum demanded if the counter value has been reached. Once the counter minus 1 value has been reached, it can be determined if a number of programmed bit corresponding to the counter value has been reached. It is allowed to do this if the maximum number of attempts or the maximum voltage value has not been reached. If one or the other of those two conditions has been reached (without having reached the counter value), there may be an error in the whole programming sequence and an ECC1 may be obtained. Therefore, in a subsequent programming phase, when the syndrome value may be requested, a value "1" would be obtained, but this does not mean that the output codeword is necessarily wrong but simply that there is an error inside that can be corrected by the ECC1. The presence of two errors is so low under a probabilistic evaluation that may be disregarded.

A different approach may be adopted according to which one of the writing algorithms is performed. In the programming phase of the logic value "0", there is only the counter, while in the programming phase of the logic value "1", there is also the ECC. If the error happens during the programming phase of the logic value "1", it would be required to obtain all corrected bits during the subsequent programming phase of the logic value "0". If, on the contrary, the single error happens during the initial programming phase of the logic value "0", a correct data will be obtained from the ECC during the subsequent programming phase of the logic value "1".

The programming sequence is stopped at CNT−1 since statistically the last bit could present problems or could be programmed using a higher voltage value and after the testing phase it may be decided how to treat that final extra bit having already in hands the information concerning the correctness of the previous programming phase.

Figure 8:
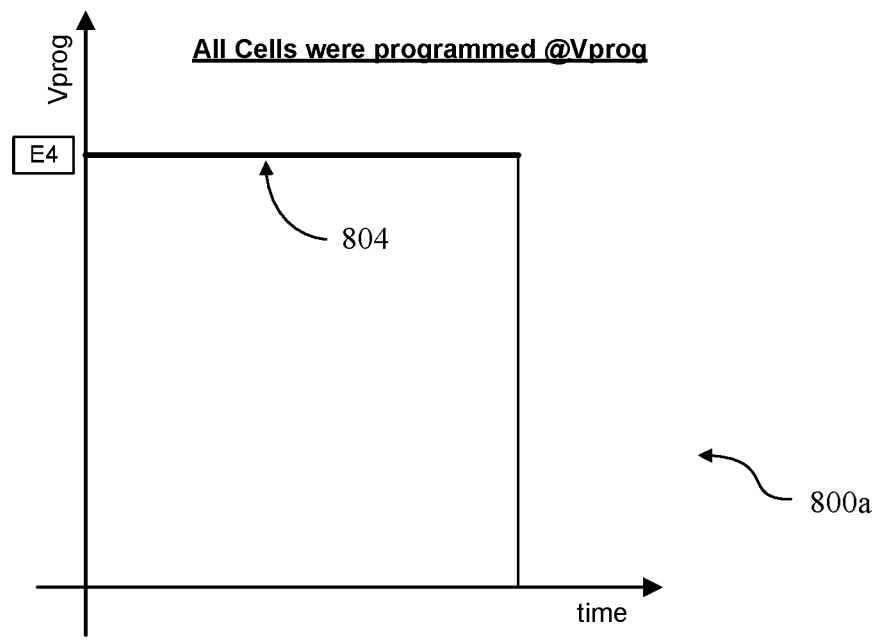
FIG. 8 illustrates few curves indicating a lower power consumption of the programming phase adopting the method of the present disclosure compared with a traditional method.
Figure 8:
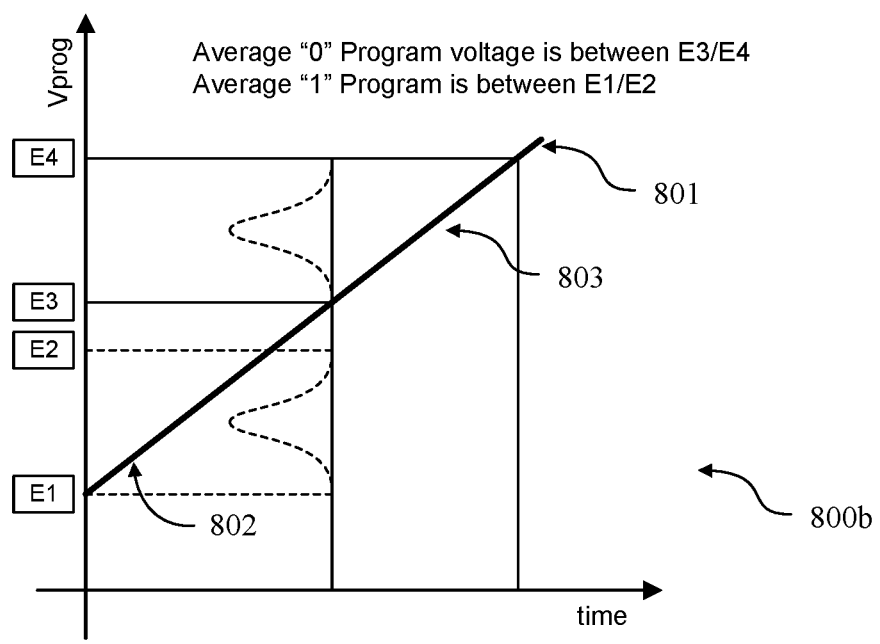

FIG. 8 shows the power consumption comparison of the current program algorithm and proposed solution. The right diagram 800b of the figure reports the voltages versus time that are used to complete the programming phase. The programming pulse comprises applying a rising voltage, such as a voltage ramp 801, to memory cells. Cells initially in a logic state "1" threshold at a programming voltage in the range E1-E2 (portion 802 of the programming voltage ramp) and are not overbiased. Only cells initially in a logic state "0" are biased at a programming voltage in the range E3-E4

(portion 803 of the programming voltage ramp) in order to threshold. Threshold voltage distributions for memory cells are shown in dotted lines for both the cells in logic "1" and logic "0" states. In the left diagram 800a, if a single programming pulse 804 is applied, the cells having the lower threshold would be stressed much more. Therefore, the average voltage program and thus the power consumption are reduced with respect to the current program algorithm.

Figure 9:
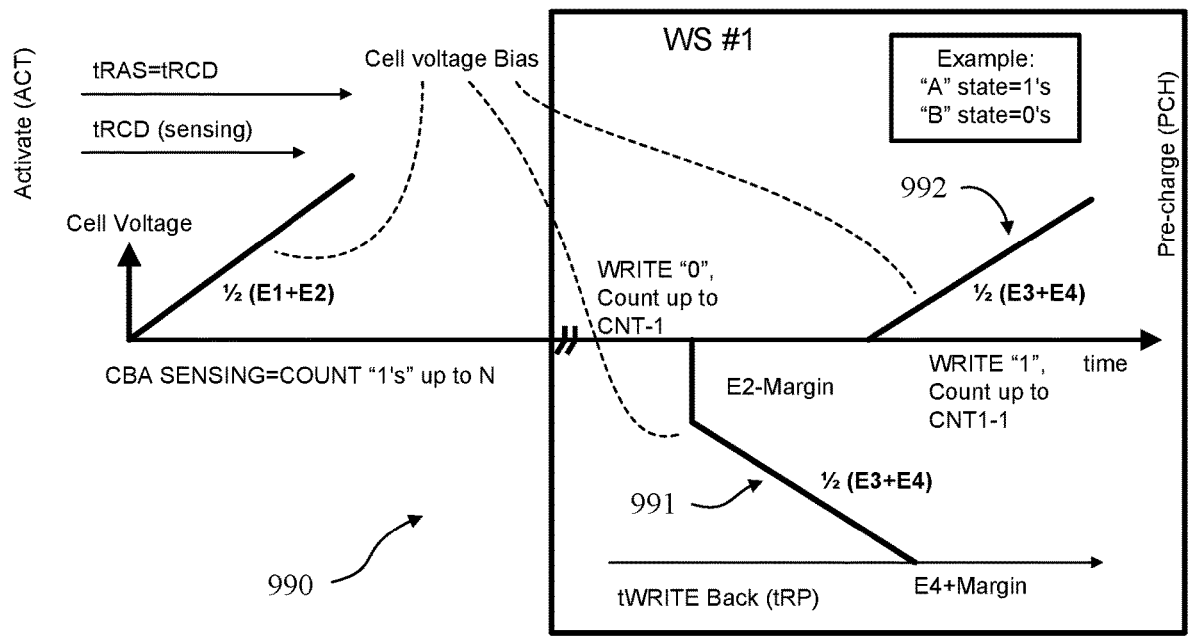
FIG. 9 illustrates an example of the programming phase of the on-the-fly programming and verifying method for memory cells based on counters and ECC feedback in accordance with examples of the present disclosure.

FIG. 9 illustrates an example of the programming phase of the on-the-fly programming and verifying method for memory cells based on counters and ECC feedback in accordance with examples of the present disclosure. FIG. 9 illustrates an example of WS1 990 after a read cycle. The blue line 991 shows the programming phase versustime of the logic value "0" and the subsequent programming phase of the logic value "1". The average programming voltage for the logic value "0" is between E3 and E4, e.g., ½(E3+E4) in the average. The programming phase of the logic value "0" is stopped when the counter value has been reached, i.e. CNT0. Then, it may be required to take care of the other logic value "1" that may still be programmed.

The raising positive red ramp 992 for programming the logic value "1" is activated and proceeds with a value between E3 and E4, ½(E3+E4) in the average, up to CNT1-1. At this point, the situation may be entered in which the codeword may be correct. If a single lazy bit is missing, some extra pulses may be applied to force the switching of a lazy bit. In any case, a condition has been reached wherein the codeword may be corrected by the ECC. Therefore, the ECC may be checked at this point.

If, at the end of the programming phase, there is only one bit to correct, the error can even be kept and a signal may be sent to the controller for suggesting to refresh just the codewords that have reported the presence of an error. For instance, having obtained a programmed codeword with a single error (still corrigible by the ECC) could suggest to shift to another memory location the new programming phase of the codeword that will replace this last one.

Figure 10:
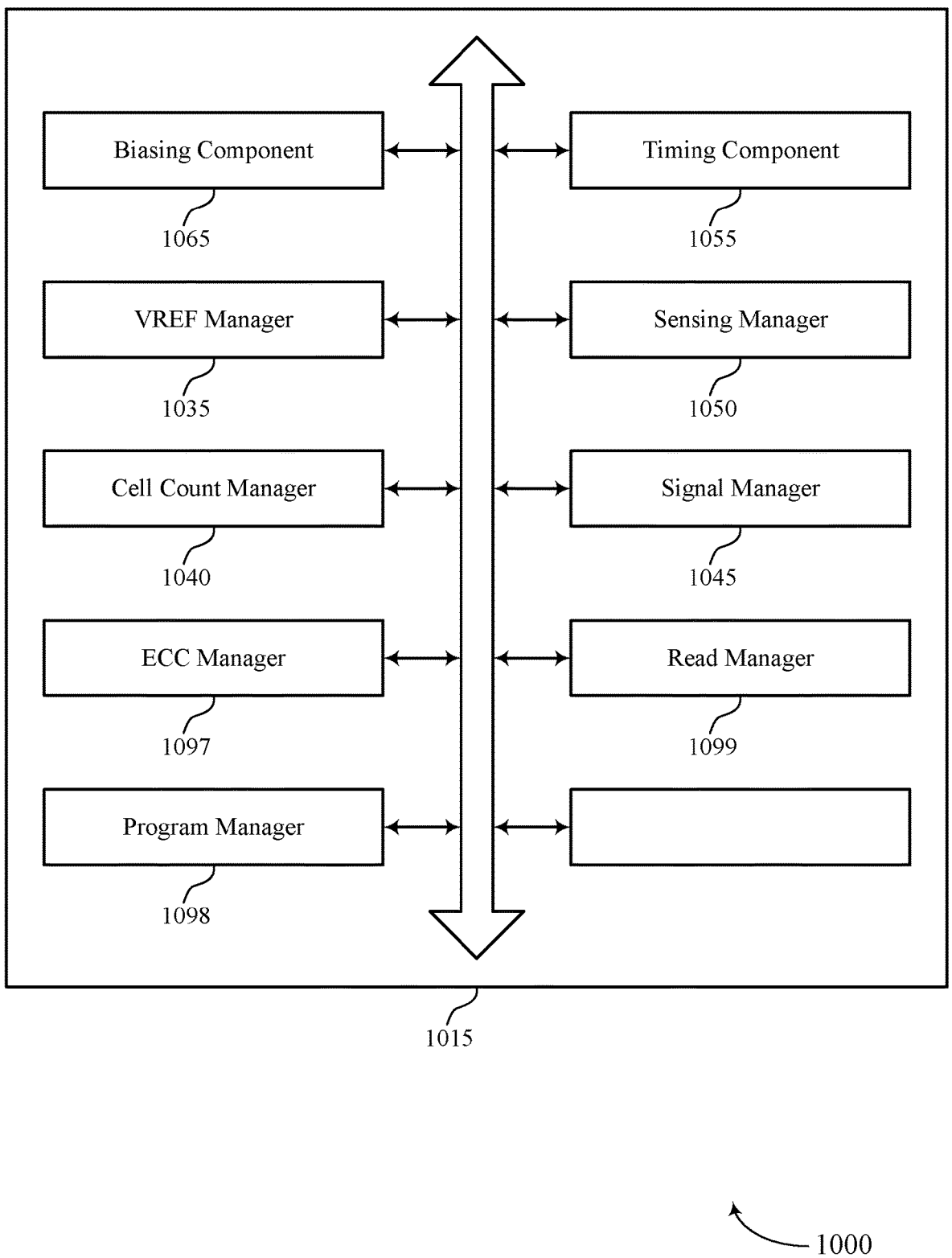
FIG. 10 illustrates a block diagram of a memory controller that may support the on-the-fly programming and verifying method for memory cells based on counters and ECC feedback in accordance with examples of the present disclosure.

FIG. 10 illustrates a block diagram of a memory controller 1015 that may support the on-the-fly programming and verifying method for memory cells based on counters and ECC feedback in accordance with examples of the present disclosure. The memory controller 1015 may be an example of a memory controller 140 described with reference to FIG. 1 or a memory controller 515 described with reference to FIG. 5. The memory controller 1015 may include a biasing component 1065 and a timing component 1055, which may be examples of biasing component 550 and timing component 555 described with reference to FIG. 5. The memory controller 1015 may also include a signal manager 1045 that provides control signals to different components in the memory device and, in particular, cooperates with biasing component 1065 and timing component 1055 to bias memory cells during access operations.

The memory controller 1015 may also include a program manager 1098 to manage access operations during a program phase. For example, program manager may manage a codeword program operation as described with reference to FIG. 6. The memory controller 1015, through its programming manager 1098 may receive user data. In some examples, the memory controller 1015 may read a previous user data from the memory cells and write a new user data and merge the new user data with the previous user data into write registers. Then, a mask register information may be generated, and wherein the mask register information may indicate bits of the previous user data stored in the memory cells to be switched or not to be switched in their logic values. In some examples, the memory controller 1015 may count numbers of a first logic value (logic "0") and a second logic value (logic "1") to be written using the mask register information, respectively, and store the numbers of the first logic value and the second logic value into a first counter and a second counter, respectively. In some examples, the memory controller 1015 may apply a programming pulse to the memory cells according to the mask register information.

Memory controller 1015 may also include a read manager 1099 to manage access operation during a read access, such as a codeword read, for example. The read manager, in cooperation with a sensing manager 1050, a reference voltage manager (or VREF manager) 1035 and a cell count manager 1040 may implement the method described herein with reference to FIGS. 6-7, for example. Each memory cell in the codeword is determined to be in one or another logic state with respect to the reference voltage and the reference voltage is modified, under the control of the VREF manager 1035, until a count of cells in the predefined logic state, as determined by the cell count manager 1040, meets a criterium. In some examples, the criterium is a match of the memory cells count (as determined with respect to the last varied reference voltage) with a number of bits expected in that logic state, the number of bits in the predetermined logic state having been retrieved from the memory location where it was stored during the last programming operation. In some examples, the criterium may comprise the memory cell count not differing from the expected number of bits in the predefined logic state by more than a detection capability of an error correction engine (ECC). In these cases, under the control of an ECC manager 1097, an error correction algorithm may be applied to the memory cells of the codeword as sensed with respect to the last modified reference voltage. The ECC algorithm may be applied a plurality of times in a sort of try and repeat approach.

Biasing 1065 and timing 1055 components, as well as VREF manager 1035, signal manager 1045, program manager 1098, read manager 1099, sensing manager 1050, VREF manager 1035, cell count manager 1040, ECC manager 1097 and other components or modules in the memory controller may communicate, directly or indirectly, with one another (e.g., via one or more buses).

Figure 11:
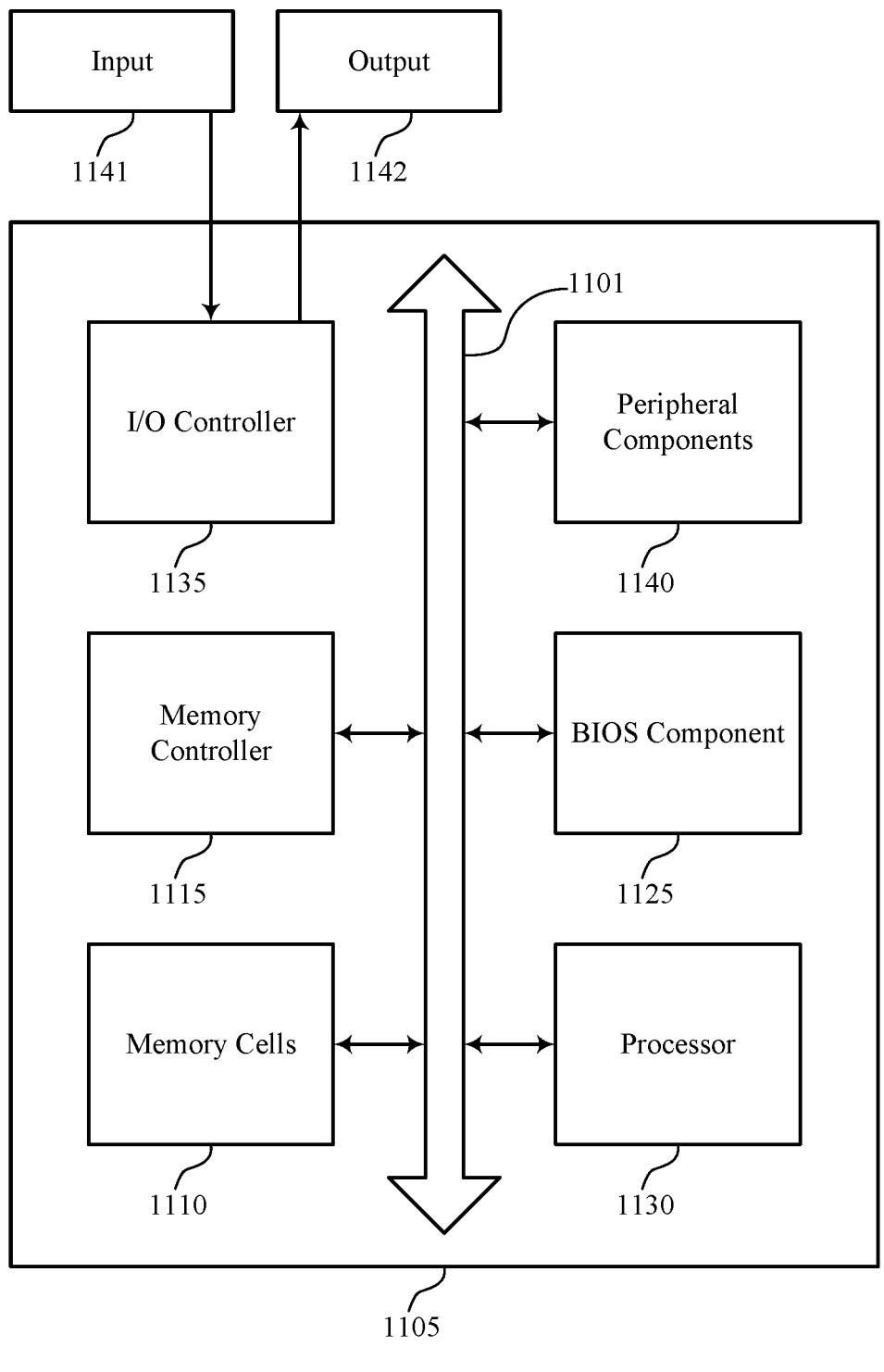
FIG. 11 illustrates a diagram of a system including a device that may support the on-the-fly programming and verifying method for memory cells based on counters and ECC feedback in accordance with examples of the present disclosure.

FIG. 11 illustrates a diagram of a system including a device that may support the on-the-fly programming and verifying method for memory cells based on counters and ECC feedback in accordance with examples of the present disclosure. The device 1105 may be an example of or include the components of memory device 100 as described above, for example, with reference to FIG. 1. The device 1105 may include components for bi-directional communications including components for transmitting and receiving communications, including a memory controller 1115, memory cells 1110, a basic input/output system (BIOS) component 1125, a processor 1130, an I/O controller 1135, and peripheral components 1140. These components may be in electronic communication via one or more busses (e.g., bus 1101).

The memory controller 1115 may operate one or more memory cells as described herein. Specifically, the memory controller 1115 may be configured to support the described on-the-fly programming and verifying method for memory cells based on counters and ECC feedback. In some cases, the memory controller 1115 may include a row component, a column component, or a combination thereof, as described with reference to FIG. 1.

The memory cells 1110 may be an example of memory cells 105 or 510 described with reference to FIGS. 1 and 5, and may store information (e.g., in the form of a logic state) as described herein.

The BIOS component 1125 be a software component that includes BIOS operated as firmware, which may initialize and run various hardware components. The BIOS component 1125 may also manage data flow between a processor and various other components, such as peripheral components, I/O control components, and others. The BIOS component 1125 may include a program or software stored in read only memory (ROM), flash memory, or any other non-volatile memory.

The processor 1130 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component). In some cases, the processor 1130 may be configured to operate a memory array using a memory controller. In other cases, a memory controller may be integrated into the processor 1130. The processor 1130 may be configured to execute computer-readable instructions stored in a memory to perform various functions.

The I/O controller 1135 may manage input and output signals for the device 1105. The I/O controller 1135 may also manage peripherals not integrated into the device. In some cases, the I/O controller 1135 may represent a physical connection or port to an external peripheral. In some cases, the I/O controller 1135 may utilize an operating system such as iOS®, ANDROID®, MS-DOS®, MS-WINDOWS®, OS/2®, UNIX®, LINUX®, or another known operating system. In other cases, the I/O controller 1135 may represent or interact with a modem, a keyboard, a mouse, a touchscreen, or a similar device. In some cases, the I/O controller 1135 may be implemented as part of a processor. In some cases, a user may interact with the device 1105 via the I/O controller 1135 or via hardware components controlled by the I/O controller 1135. The I/O controller 1135 may support accessing the memory cells 1110, including receiving information associated with the sensed logic state of one or more of the memory cells 1110, or providing information associated with writing a logic state of one or more of the memory cells 1110.

The peripheral components 1140 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

The input 1141 may represent a device or signal external to the device 1105 that provides input to the device 1105 or its components. This may include a user interface or an interface with or between other devices. In some cases, the input 1141 may be managed by the I/O controller 1135 and may interact with the device 1105 via a peripheral component 1140.

The output 1142 may represent a device or signal external to the device 1105 configured to receive output from the device 1105 or any of its components. Examples of the output 1142 may include a display, audio speakers, a printing device, another processor or printed circuit board, or other devices. In some cases, the output 1142 may be a peripheral element that interfaces with the device 1105 via the peripheral component(s) 1140. In some cases, the output 1142 may be managed by the I/O controller 1135.

The components of the device 1105 may include circuitry designed to carry out their functions. This may include various circuit elements, for example, conductive lines, transistors, capacitors, inductors, resistors, amplifiers, or other active or inactive elements, configured to carry out the functions described herein. The device 1105 may be a computer, a server, a laptop computer, a notebook computer, a tablet computer, a mobile phone, a wearable electronic device, a personal electronic device, or the like. Or the device 1105 may be a portion or element of such a device.

The description herein provides examples, and is not limiting of the scope, applicability, or examples set forth in the claims. Changes may be made in the function and arrangement of elements discussed without departing from the scope of the disclosure. Some examples may omit, substitute, or add various operations, procedures, or components as appropriate. Also, features described with respect to some examples may be combined in other examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V), or more generally represents a reference voltage of the electrical circuit or device including the electrical circuit, which may or may not be directly coupled with ground. Accordingly, the voltage of a virtual ground may temporarily fluctuate and return to approximately 0V, or virtual 0V, at steady state. A virtual ground may be implemented using various electronic circuit elements, such as a voltage divider consisting of operational amplifiers and resistors. Other implementations are also possible. "Virtual grounding" or "virtually grounded" means connected to approximately 0V, or some other reference voltage of a device.

The term "electronic communication" and "coupled" refers to a relationship between components that supports electron flow between the components. This may include a direct connection or coupling between components or may include intermediate components. In other words, components that are "connected with" or "coupled with" are in electronic communication with each other. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected or coupled via a switch (e.g., a transistor) are in electronic communication regardless of the state of the switch (e.g., open, closed).

The phrase "coupled between" may refer to an order of components in relation to each other, and may refer to an electrical coupling. In one example, a component "B" that is electrically coupled between a component "A" and a component "C" may refer to an order of components of "A-B-C" or "C-B-A" in an electrical sense. In other words, electrical signals (e.g., voltage, charge, current) may be passed from component A to component C by way of component B.

A description of a component B being "coupled between" component A and component C may not be interpreted as precluding other intervening components in the described order. For example, a component "D" may be coupled between the described component A and component B (e.g., referring to an order of components of "A-D-B-C" or "C-B-D-A" as examples), while still supporting component B being electrically coupled between component A and component C. In other words, the use of the phrase "coupled between" should not be construed as necessarily referencing an exclusive sequential order.

Further, a description of component B being "coupled between" component A and component C does not preclude a second, different coupling between component A and component C. For example, component A and component C may be coupled with each other in a separate coupling that is electrically parallel with a coupling via component B. In another example, component A and component C may be coupled via another component "E" (e.g., component B being coupled between component A and component C and component E being coupled between component A and component C). In other words, the use of the phrase "coupled between" should not be construed as an exclusive coupling between components.

The term "isolated" refers to a relationship between components in which electrons are not presently capable of flowing between them; components are isolated from each other if there is an open circuit between them. For example, two components physically coupled by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the application of voltage and/or flow of charge between components (or lines) that are in electronic communication.

As used herein, the term "terminal" may not suggest a physical boundary or connection point of a circuit element. Rather, "terminal" may refer to a reference point of a circuit relevant to the circuit element, which may also be referred to as a "node" or "reference point".

The devices discussed herein, including memory device, circuit and the like, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, such as metals. The source and drain may be conductive and may comprise a heavily-doped, or degenerate semiconductor region. The source and drain may be separated by a lightly-doped semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (e.g., A and B and C).

As used herein, the term "substantially" means that the modified characteristic (e.g., a verb or adjective modified by the term "substantially") may not be absolute but is close enough so as to achieve the advantages of the characteristic, or close enough that the characteristic referred to is true in the context of the relevant aspects of the disclosure.

As used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on".

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method of operating memory cells, comprising:
   receiving a previous user data and a new user data;
   determining mask register information based at least in part on receiving the previous user data and the new user data;
   counting one or more first quantities of a first logic value and one or more second quantities of a second logic value to be written based at least in part on the mask register information and the new user data;
   storing a quantity of bits having the first logic value into a first counter and storing a quantity of bits having the second logic value into a second counter;
   applying a programming pulse to the memory cells according to the mask register information based at least in part on initiating a write sequence programming sequence using a first write sequence or a second write sequence; and
   performing an error correction operation based at least in part on comparing a quantity of programmed memory cells to a threshold quantity of programmed memory cells having the first logic value or the second logic value.

2. The method of claim 1, wherein determining the mask register information comprises:
   writing the new user data into the memory cells;
   merging the new user data with the previous user data into write registers; and
   generating the mask register information, wherein the mask register information identifies which bits of the previous user data stored in the memory cells match bits of the new user data.

3. The method of claim 1, wherein the first write sequence corresponds to a first voltage value and the second write sequence corresponds to a second voltage value, and wherein the first voltage value is an upper voltage value and the second voltage value is a down voltage value.

4. The method of claim 1, further comprising:
   comparing a logic value of each bit of the new user data with a corresponding bit of the previous user data, wherein counting the one or more first quantities of the first logic value and the one or more second quantities of the second logic value is based at least in part on comparing the logic value of each bit of the new user data with the corresponding bit of the previous user data.

5. The method of claim 1, further comprising:
   identifying one or more memory cells that are not programmed to a first logic state or a second logic state; and
   applying an additional programming pulse to each of the one or more memory cells that are not programmed to the first logic state or the second logic state.

6. The method of claim 1, wherein the error correction operation further comprises:
   computing an ECC parity corresponding to the new user data.

7. The method of claim 6, further comprising:
   counting a quantity of the memory cells to be switched in logic value during the applying of the programming pulse; and
   applying the programming pulse to the memory cells using at least ECC feedback, wherein the ECC feedback is based at least in part on comparing the quantity of programmed memory cells to the threshold quantity of programmed memory cells having the first logic value or the second logic value.

8. The method of claim 1, wherein the threshold quantity of programmed memory cells is less than the quantity of bits stored in the first counter, or the second counter, or both.

9. The method of claim 1, wherein initiating the write sequence programming sequence comprises initiating the first write sequence or the second write sequence.

10. An apparatus, comprising:
    a controller associated with a memory device, wherein the controller is configured to cause the apparatus to:
    receive a previous user data and a new user data;
    determine mask register information based at least in part on receiving the previous user data and the new user data;
    count one or more first quantities of a first logic value and one or more second quantities of a second logic value to be written based at least in part on the mask register information and the new user data;
    store a quantity of bits having the first logic value into a first counter and storing a quantity of bits having the second logic value into a second counter;
    apply a programming pulse to memory cells of the memory device according to the mask register information based at least in part on initiating a write sequence programming sequence using a first write sequence or a second write sequence; and
    perform an error correction operation based at least in part on comparing a quantity of programmed memory cells to a threshold quantity of programmed memory cells having the first logic value or the second logic value.

11. The apparatus of claim 10, wherein determining the mask register information is configured to cause the apparatus to:
    write the new user data into the memory cells;
    merge the new user data with the previous user data into write registers; and generate the mask register information, wherein the mask register information identifies which bits of the previous user data stored in the memory cells match bits of the new user data.

12. The apparatus of claim 10, wherein:
the first write sequence corresponds to a first voltage value and the second write sequence corresponds to a second voltage value, and
the first voltage value is an upper voltage value and the second voltage value is a down voltage value.

13. The apparatus of claim 10, wherein the controller is further configured to cause the apparatus to:
compare a logic value of each bit of the new user data with a corresponding bit of the previous user data, wherein counting the one or more first quantities of the first logic value and the one or more second quantities of the second logic value is based at least in part on comparing the logic value of each bit of the new user data with the corresponding bit of the previous user data.

14. The apparatus of claim 10, wherein the controller is further configured to cause the apparatus to:
identify one or more memory cells that are not programmed to a first logic state or a second logic state; and
apply an additional programming pulse to each of the one or more memory cells that are not programmed to the first logic state or the second logic state.

15. The apparatus of claim 10, wherein the error correction operation is further configured to cause the apparatus to:
compute an ECC parity corresponding to the new user data.

16. The apparatus of claim 15, wherein the controller is further configured to cause the apparatus to:
count a quantity of the memory cells to be switched in logic value during the applying of the programming pulse; and
apply the programming pulse to the memory cells using at least ECC feedback, wherein the ECC feedback is based at least in part on comparing the quantity of programmed memory cells to the threshold quantity of programmed memory cells having the first logic value or the second logic value.

17. The apparatus of claim 10, wherein the threshold quantity of programmed memory cells is less than the quantity of bits stored in the first counter, or the second counter, or both.

18. The apparatus of claim 10, wherein initiating the write sequence programming sequence comprises initiating the first write sequence or the second write sequence.

19. A memory device comprising:
an array of memory cells;
at least one codeword stored in the array of memory cells including a previous user data;
a memory controller configured to execute instructions for accessing the memory cells; and
a circuit for accessing the memory cells, the circuit being operatively coupled with the array of memory cells and configured to:
receive a new user data;
determine mask register information based at least in part on receiving the new user data;
count quantities of a first logic value and quantities of a second logic value to be written based at least in part on the mask register information and the new user data;
store a first quantity of bits having the first logic value into a first counter and storing a second quantity of bits having the second logic value into a second counter;
apply a programming pulse to the memory cells according to the mask register information based at least in part on initiating a programming sequence using a first write sequence or a second write sequence; and
perform an error correction procedure based at least in part on comparing a quantity of programmed memory cells to a threshold quantity of programmed memory cells having the first logic value or the second logic value.

20. The memory device of claim 19, wherein the circuit for accessing the memory cells is further configured to:
write the new user data and merging the new user data with the previous user data into write registers; and
generate the mask register information, wherein the mask register information identifies which bits of the previous user data stored in the memory cells match logic values of the new user data.

* * * * *